United States Patent
Saint Martin et al.

(10) Patent No.: US 9,923,571 B2
(45) Date of Patent: Mar. 20, 2018

(54) RAMP ANALOG-DIGITAL CONVERTER ABLE TO PROVIDE AN AVERAGE OF TWO SIGNALS DIRECTLY

(71) Applicant: PYXALIS, Moirans (FR)

(72) Inventors: Laurent Saint Martin, Grenoble (FR); Grégoire Chenebaux, Grenoble (FR)

(73) Assignee: Pyxalis, Moirans (FR)

( * ) Notice: Subject to any disclaimer, the term of this patent is extended or adjusted under 35 U.S.C. 154(b) by 0 days.

(21) Appl. No.: 15/309,259

(22) PCT Filed: May 4, 2015

(86) PCT No.: PCT/EP2015/059727
§ 371 (c)(1),
(2) Date: Nov. 22, 2016

(87) PCT Pub. No.: WO2015/169755
PCT Pub. Date: Nov. 12, 2015

(65) Prior Publication Data
US 2017/0077943 A1    Mar. 16, 2017

(30) Foreign Application Priority Data
May 5, 2014  (FR) .................................... 14 54062

(51) Int. Cl.
| | |
|---|---|
| H03M 1/56 | (2006.01) |
| H03M 1/06 | (2006.01) |
| H04N 5/357 | (2011.01) |
| H04N 5/378 | (2011.01) |
| H03M 1/00 | (2006.01) |
| H03M 1/12 | (2006.01) |

(52) U.S. Cl.
CPC .......... *H03M 1/56* (2013.01); *H03M 1/0634* (2013.01); *H03M 1/1245* (2013.01); *H04N 5/3575* (2013.01); *H04N 5/378* (2013.01); *H03M 1/00* (2013.01); *H03M 1/12* (2013.01); *H03M 1/123* (2013.01); *H03M 1/1225* (2013.01)

(58) Field of Classification Search
CPC ............ H03M 1/56; H03M 1/12; H03M 1/00; H03M 1/1225
USPC ................................ 341/169, 155, 156, 141
See application file for complete search history.

(56) References Cited

U.S. PATENT DOCUMENTS

| | | |
|---|---|---|
| 2009/0021411 A1 | 1/2009 | Maruyama |
| 2009/0066554 A1 | 3/2009 | Lim |

(Continued)

*Primary Examiner* — Joseph Lauture
(74) *Attorney, Agent, or Firm* — Baker Hostetler LLP

(57) ABSTRACT

Ramp analog-digital converters used in matrix image sensors to provide a digital value representative of a level of illumination of a pixel are provided. Two voltage samples are applied to a comparator, a counter is used to count pulses at a frequency F from a starting instant of the ramp until a toggling of the comparator. Two other voltage samples, one of which is added to a linear voltage ramp having an identical starting instant and slope to the first ramp, are applied to a second comparator, a half counting frequency F/2 is applied to the counter from the toggling of one of the comparators, and the content of the counter at the moment of toggling of the other comparator is stored. Two measurements of samples of the same signal or of two different signals are averaged without undergoing a digital conversion for each signal and a digital addition.

9 Claims, 7 Drawing Sheets

(56) References Cited

U.S. PATENT DOCUMENTS

2009/0309991 A1 12/2009 Lim et al.
2014/0361916 A1* 12/2014 Wolfs .................... H03M 1/185
 341/155

* cited by examiner

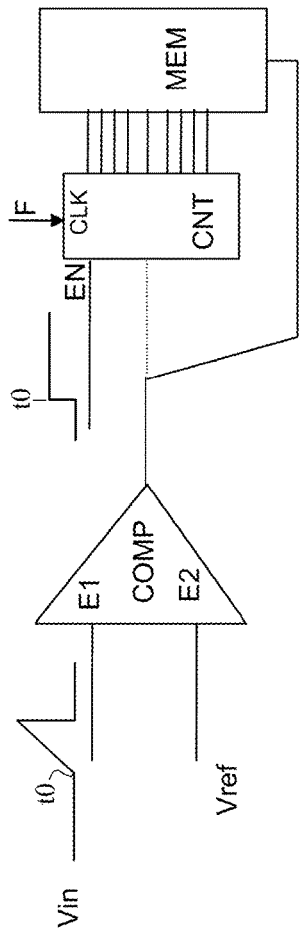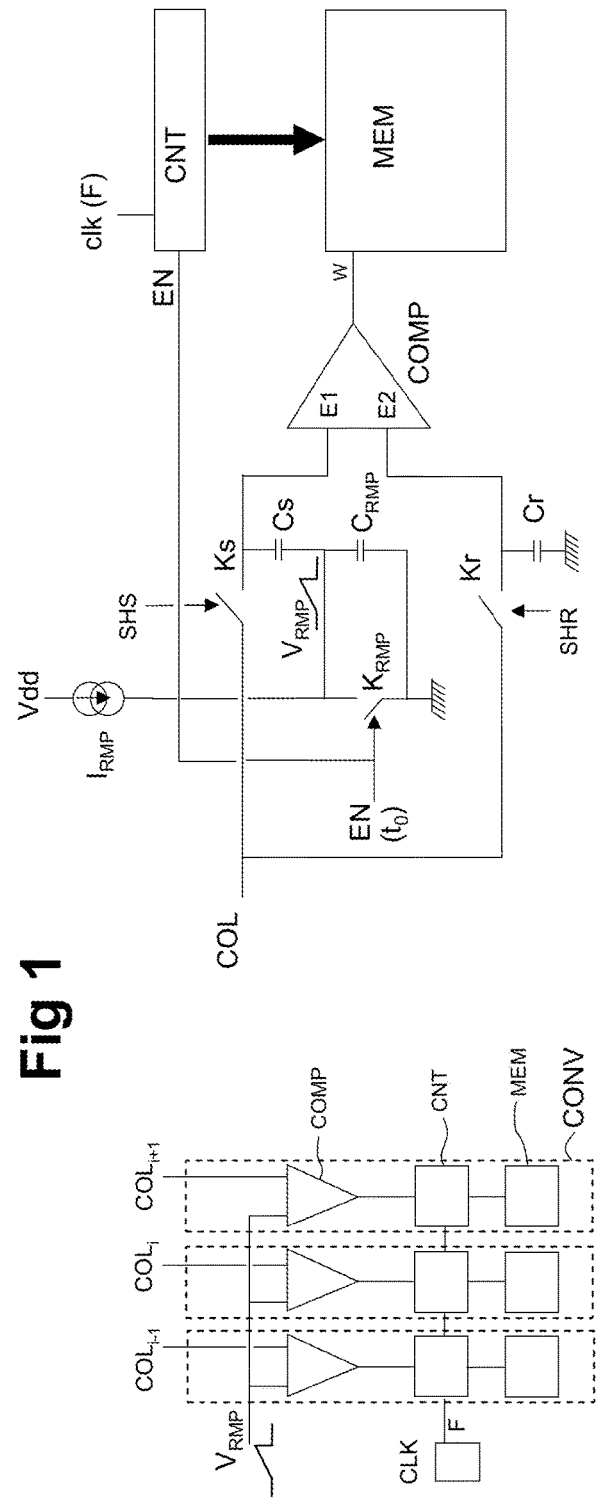

RAMP ANALOG-DIGITAL CONVERTER ABLE TO PROVIDE AN AVERAGE OF TWO SIGNALS DIRECTLY

CROSS-REFERENCE TO RELATED APPLICATIONS

This application is a National Stage of International patent application PCT/EP2015/059727, filed on May 4, 2015, which claims priority to foreign French patent application No. FR 1454062, filed on May 5, 2014, the disclosures of which are incorporated by reference in their entirety.

FIELD OF THE INVENTION

The invention concerns ramp analog-digital converters, used particularly, but not exclusively, in matrix image sensors for providing a digital value that is representative of a level of illumination of a pixel.

BACKGROUND

Ramp analog-digital converters use
a comparator receiving a reference voltage and a useful voltage with the aim of converting the difference between the useful voltage and the reference voltage,
a rising or falling linear voltage ramp, which is superimposed on one of the voltages from a given instant,
a digital counter that counts pulses at a fixed rate from the start of the ramp;
a memory that preserves the content reached by the counter at the instant at which the output state of the comparator toggles on account of the voltage variation caused by the ramp and applied to the comparator.
The content of the counter is a digital representation of the difference between the useful voltage and the reference voltage.
In an image sensor, the reference voltage may be a voltage sampled on a column conductor after a reset operation for a pixel, and the useful voltage is the voltage sampled on this same column conductor in a read operation for the charges generated in the pixel by the illumination.
For various reasons that will be returned to later, there may be a requirement to convert two useful voltages and to take the average of the results of the conversion. To give a quick example, there may be a need to simultaneously convert the signals from two adjacent pixels in a matrix sensor and to obtain the average of the results; the values provided by two adjacent pixels when there is not a lot of light and a loss of image resolution is accepted are grouped together. In another example, there may be a need to reduce reading noise for the pixels by taking two successive samples of the voltage to be converted, by converting these two voltages and by taking the average of the results of the conversion.
In these two examples, the solution involves performing two (simultaneous or otherwise) analog-digital conversions and digitally adding the results of the two conversions. However, this solution requires processing of digital values, which is ponderous and cumbersome in an integrated circuit, for example when this processing needs to be performed on hundreds of columns of a matrix.

SUMMARY OF THE INVENTION

In order to make it possible to take an average of two measurements more simply, the invention proposes an analog-digital conversion method using a ramp converter, in which
two voltage samples, one of which is added to a linear voltage ramp, are applied to a comparator,
a counter is used to count pulses at a frequency F from a starting instant of the ramp up until a toggling of the comparator,
characterized in that:
two other voltage samples, one of which is added to a linear voltage ramp with a starting instant and slope that are identical to those of the first ramp, are applied to a second comparator,
a half counting frequency F/2 is applied to the counter from the toggling of the one of the two comparators, and the content of the counter at the moment of toggling of the other comparator is stored.
The content of the counter then represents a digital average of two analog voltage differences that are the difference between the first two voltage samples applied to the first comparator and the other two voltage samples applied to the second comparator.
This method is implemented by a ramp analog-digital converter that has a circuit setting up a voltage ramp, a counter incremented by a clock signal at a frequency F from a starting instant of the ramp, a comparator for comparing two voltage samples, one of which is added to the ramp, characterized in that the converter has a second comparator for comparing two other voltage samples, one of which is added to a ramp that is identical to the first ramp, a logic circuit for selecting a counting frequency for the counter, controlled by the comparators, in order to select the frequency F at the start of the ramp and to select a half frequency F/2 from toggling of one of the comparators, and a means for storing the content of the counter at the moment of toggling of the other comparator.
In a first use, the two comparators receive samples of one and the same voltage difference to be converted, that is to say a first pair of samples of the voltages whose difference needs to be converted and a second pair of samples of these voltages. Conversion noise is reduced by the obtainment of an average of two conversions without this average requiring two conversions followed by a digital addition. The samples of the same voltage difference to be converted may be samples taken at the same instant or samples taken at two different instants, preferably at two instants that are very close together.
In a second use, the two comparators receive simultaneous samples of two different (but similar) voltage differences and the converter provides a value that is the average of these two differences.
In the case of an image sensor, the voltage differences to be converted are provided by column conductors (connecting the pixels of one and the same column) successively providing a potential representing a reset level for the pixel (reset of a photodiode or of a charge storage node) and a potential representing the illumination of a pixel. The voltage differences applied to the two comparators are then either from one and the same column conductor (in order to reduce the influence of measurement noise) with a double sampling performed at four different instants on the column conductor, or from two (preferably immediately adjacent) column conductors, with simultaneous samplings for the two columns, with the aim of providing a measurement of the average of the illuminations received by two pixels.
Generally, in this description, the converter is considered to convert voltage samples, since it is understood that one of the voltage samples may equally be either a fixed voltage provided by a reference source without there being the need for a sampler, or a variable voltage sample provided by a sample and hold circuit.

The invention can be generalized with the aim of taking an average of more than two measurements. In this case, the invention proposes an analog-digital conversion method using a ramp converter, in which:

two voltage samples, one of which is added to a linear voltage ramp, are applied to a comparator, a counter is used to count pulses at a frequency F from a starting instant of the ramp up until a toggling of the comparator, characterized in that:

N−1 other pairs of two voltage samples, one of which is added to a linear voltage ramp with a starting instant and slope that are identical to those of the first ramp, are applied to N−1 other comparators, a counting frequency $F_{N-1}$ is applied to the counter so that $F_{N-1}=F(N-1)/N$ from the toggling of a comparator, lower counting frequencies $F(N-2)/N$, then $F(N-3)/N$, and so on up to $F/N$ are successively applied to the counter each time a comparator toggles, and the content of the counter at the moment of toggling of the comparator that toggles last is stored.

The content of the counter then represents a digital average of N analog voltage differences that are the voltage differences between the pairs of voltage samples applied to the N comparators.

In this case, the analog-digital converter according to the invention has a circuit setting up a voltage ramp, a counter incremented by a clock signal at a frequency F from a starting instant of the ramp, a comparator for comparing two voltage samples, one of which is added to the ramp, characterized in that the converter has N−1 other comparators for comparing N−1 other voltage samples, one of which is added to a ramp that is identical to the first ramp, a logic circuit for selecting a counting frequency for the counter, controlled by the comparators, in order to select the frequency F at the start of the ramp and to successively select lower frequencies in step with the toggling of the comparators, the selected frequency being $F(N-j)/N$ when j comparators have toggled, and a means for storing the content of the counter at the moment of toggling of the last comparator.

BRIEF DESCRIPTION OF THE DRAWINGS

Other features and advantages of the invention will emerge on reading the detailed description that follows and that is provided with reference to the appended drawings, in which:

FIG. 1 represents the principle of a ramp converter;

FIG. 2 represents a possible organization of the ramp converters in a matrix image sensor;

FIG. 3 represents a detailed diagram of the converter in the case of a conversion of voltage differences provided by a double sample and hold circuit;

DETAILED DESCRIPTION

Figure 4:
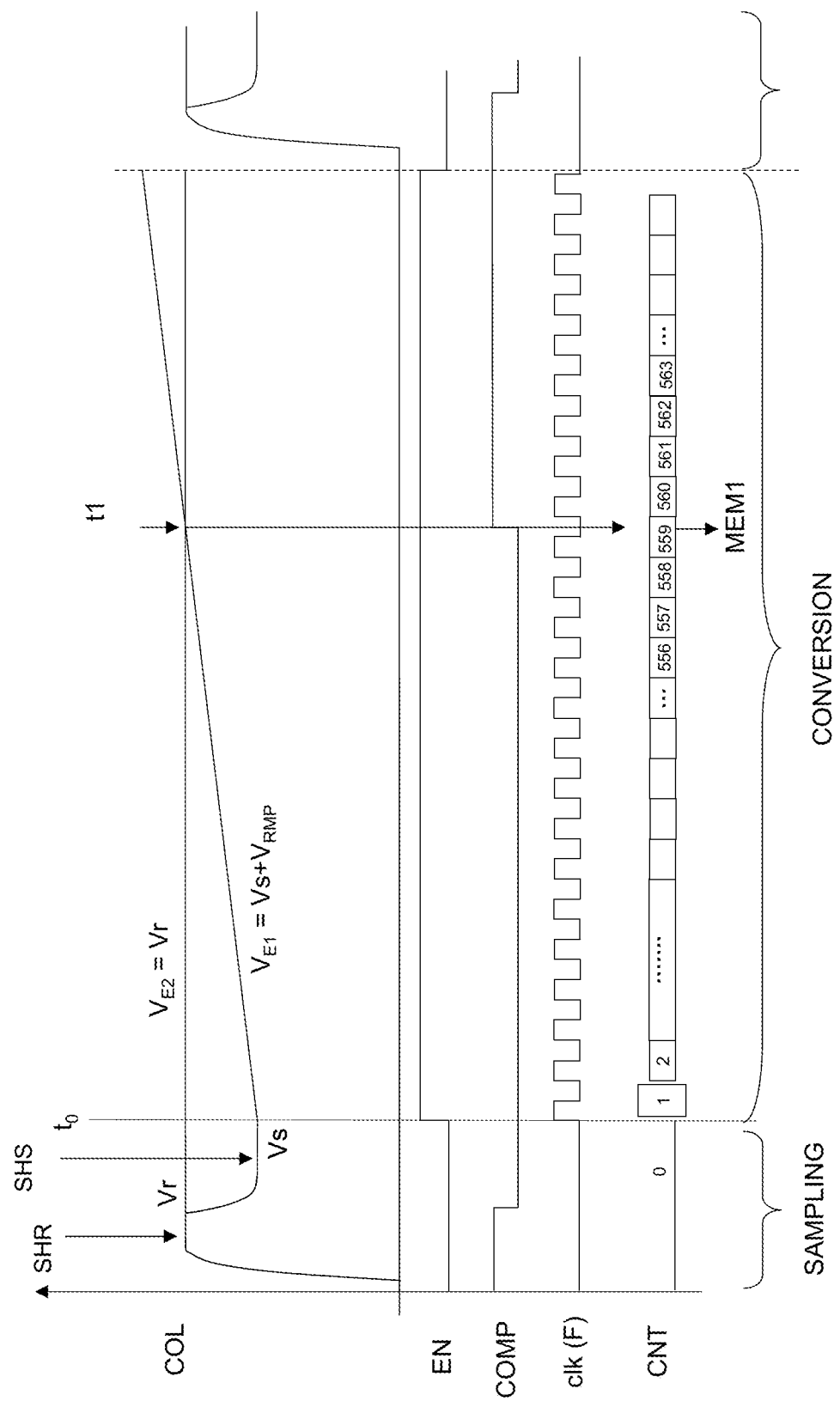
FIG. 4 is a timing diagram for an analog-digital conversion.

FIG. 1 represents the general structure of a ramp analog-digital converter that converts the difference between a variable voltage and a reference voltage into a digital value.

A voltage comparator COMP having two inputs E1, E2 receives the variable voltage Vin and the reference voltage Vref at these inputs; a rising or falling linear voltage ramp is added to one of these two voltages from an instant t0 that defines the start of the analog-digital conversion. The choice of the direction of the ramp or the choice of the input to which the ramp is applied is made on the basis of the sign of the difference between the variable voltage and the reference voltage, so that the voltages applied to the two inputs of the comparator become equal at the end of a variable time that defines the end of the conversion. Thus, if the reference voltage is lower than the variable voltage and if the voltage ramp is ascending, there is the assurance that the voltages become equal if a rising ramp is added to the reference voltage or a falling ramp is added to the variable voltage. Conversely, if the reference voltage is higher than the variable voltage, it is necessary to apply a falling voltage ramp to the reference voltage, or to add a rising ramp to the variable voltage.

As these solutions are equivalent, it will be considered by convention in the remainder of the description of the invention that the reference voltage is at a consistently higher level than the variable voltage, that the ramp is ascending and that it is added to the variable voltage. This is what is represented in FIG. 1 for a conventional converter. The voltage at the input E1 rises from Vin; the voltage at the input E2 remains at Vref during the conversion.

A counter CNT counts pulses applied to an incrementation input that receives these pulses at a clock frequency F. The counting is enabled by an enabling signal EN applied to an enabling input of the counter. This signal starts at the instant t0, which defines the start of the voltage ramp.

The output of the comparator toggles when the voltage at the input E1 reaches the value Vref on account of the ascending of the linear ramp. The toggling of the comparator then triggers storage of the content of the counter, either by stopping counting or by allowing the counter to continue but triggering storage, in a digital memory MEM, of the content of the counter at the instant of the toggling. The counter or the memory then contains a value that is representative of the time (number of clock periods at frequency F) taken to equalize the voltages at the two inputs of the comparator, and therefore representative of the difference Vref-Vin when the ramp is linear.

FIG. 2 schematically represents the use of such a ramp converter in the context of a matrix image sensor having N rows (N>=1) and P columns of pixels (P>1), which are not shown. The pixels of a row of the sensor are read on a row by row basis. A row is read in parallel for the P pixels, using as many analog-digital converters as there are pixels in the row. Each pixel of rank i of a row that is being read produces a voltage that is dependent on the illumination that it has received in the course of an integration period. This voltage is applied to a respective column conductor $COL_i$ of rank i.

The column conductors of the matrix are each connected to the input of a respective ramp analog-digital converter. To simplify the diagram of FIG. 2, the column conductor has been considered to be connected to the first input of the comparator of the respective converter, and a falling ramp starting at a reference voltage Vref has been considered to be applied to the other input. However, it will most often be preferable to apply to the input of the comparator a voltage sample taken from the column conductor and held for the time of the conversion. Equally, it is possible to provide for the reference voltage Vref to be a sampled and held voltage sample rather than a fixed voltage.

Finally, FIG. 2 represents an architecture in which a common linear voltage ramp is provided for all the converters, but it would be possible to have a ramp that is characteristic of each converter. Equally, a single clock H defining the counting frequency has been considered to exist, but there could be as many (identical) clocks as there are converters. The counters are also specific to each converter, but a single counter could be provided; the memories then receive the content of the common counter and each store the content at the moment at which they receive the order therefrom.

FIG. 3 provides a more detailed representation of an exemplary converter in the context of an image sensor providing a digital value after each phase of charge integration in a pixel.

The column conductor COL is connected to a double sampling circuit that takes two voltage samples from this conductor.

The first sample Vr is a reset voltage for the pixel. This sample is applied to a sampling capacitance Cr by the closure of a switch Kr at a moment at which the column conductor receives from the pixel a reset level representing an absence of illumination for the pixel. This level is provided by a photodiode or a node for temporary storage of charges from the pixel after this photodiode or this node has been brought to a fixed reset potential.

The second voltage sample Vs is a useful voltage level representing the illumination of the pixel. It is applied to another capacitance Cs by the closure of a switch Ks at a moment at which the column conductor receives from the pixel a voltage representing the illumination thereof. This level is provided by the photodiode after an integration time, or by the node for temporary storage of charges after the charges of a photodiode have been transferred to this node.

The voltage samples Vr and Vs are held and kept in the capacitances Cr and Cs by the opening of the respective switches Kr and Ks.

The capacitance Cr is connected between the input E2 of the comparator COMP and a zero potential ground. The capacitance Cs is connected between the input E1 of the comparator and the output of a linear voltage ramp generator. By way of example, the generator produces a ramp $V_{RMP}$ from the charging of a capacitance $C_{RMP}$ by a constant current source $I_{RMP}$. By way of example, the capacitance $C_{RMP}$ is connected to the ground. The output of the generator is taken at the point at which the capacitance $C_{RMP}$ is connected to the current source. The capacitance $C_{RMP}$ can be shorted by a switch $K_{RMP}$. The opening of this switch under the action of an enabling signal EN at an instant $t_0$ enable charging of the capacitance $C_{RMP}$ and linearly increases the potential at the input E1 of the comparator from the voltage that has been sampled in the capacitance Cs.

The counter receives a clock signal clk at frequency F. Counting is triggered by the same enabling signal EN as is used to control the opening of the switch $K_{RMP}$, that is to say by the signal that triggers the start of analog-digital conversion by starting the ramp.

The output of the comparator COMP toggles when the voltage $Vs+V_{RMP}$ at the input E1 reaches the value of the reference voltage Vr at the input E2. The toggling triggers storage of the content of the counter in the memory MEM. It will be noted that the memory can be doubled up in order to speed up the operation of the sensor: each converter has two memories, one being able to be used for reading while the other is used for writing, and vice versa; the toggling of the comparator triggers storage on each new conversion, alternately in one of the memories and then in the other. This design with two memories is not linked to the present invention and will not be described in more detail.

It will be noted that in some cases, it would be possible to provide for a fixed reference voltage to be applied to the input E2 instead of a sampled voltage from the column conductor.

FIG. 4 represents the timing diagram for a reading and analog-digital conversion sequence for a pixel of a matrix image sensor.

Selection of the row containing the pixel places a voltage on the column conductor. The voltage is a voltage Vr representing a reset level for the pixel or a useful voltage Vs representing the illumination at the moment under consideration. It will be assumed in this case that the reset level and the useful level are read from a node for temporary storage of charges of the pixel, connected by means of a read transistor for the pixel to the column conductor when the row is selected.

In the example represented in FIG. 4, the reset level Vr is read before the useful level Vs: the pixel is reset and then a short closure control signal SHR is applied to the switch Kr in order to sample the reset voltage level Vr in the capacitance Cr. This level Vr is preserved for the whole conversion phase after the switch Kr is reopened, and it is applied to the input E2 of the comparator COMP.

The charge transfer representing the illumination, from the photodiode of the pixel to the temporary storage node, causes a drop in the potential of the column conductor; a short closure control signal SHS is then applied to the switch Ks, which samples in the capacitance Cs the useful voltage level Vs representing the illumination. The capacitance Cs applies this voltage level to the input E1 of the comparator.

The state of the output of the comparator is represented on the COMP row; by convention, this is considered to be a low state at the instant $t_0$ of the start of the ramp.

At the instant $t_0$, the ascending linear voltage ramp is triggered, which increases the potential $V_{E1}=Vs+V_{RMP}$ at the input E1 from Vs.

Counting by the counter CNT is also triggered at the instant $t_0$; counting is incremented at the rate provided by a clock at frequency F. Arbitrary figures are indicated in FIG. 4 to represent the content of the counter: CNT row.

At an instant $t_1$, when the voltage $V_{E1}$ reaches the value Vr, the comparator toggles and triggers storage of the content of the counter. FIG. 4 reveals that the content is equal to 559 at the moment of toggling, and it is this value that is stored.

The comparator is reset to its initial state at the start of a subsequent reading and conversion sequence, or it returns thereto naturally at the moment of sampling of the reset level by the signal SHR.

Figure 5:
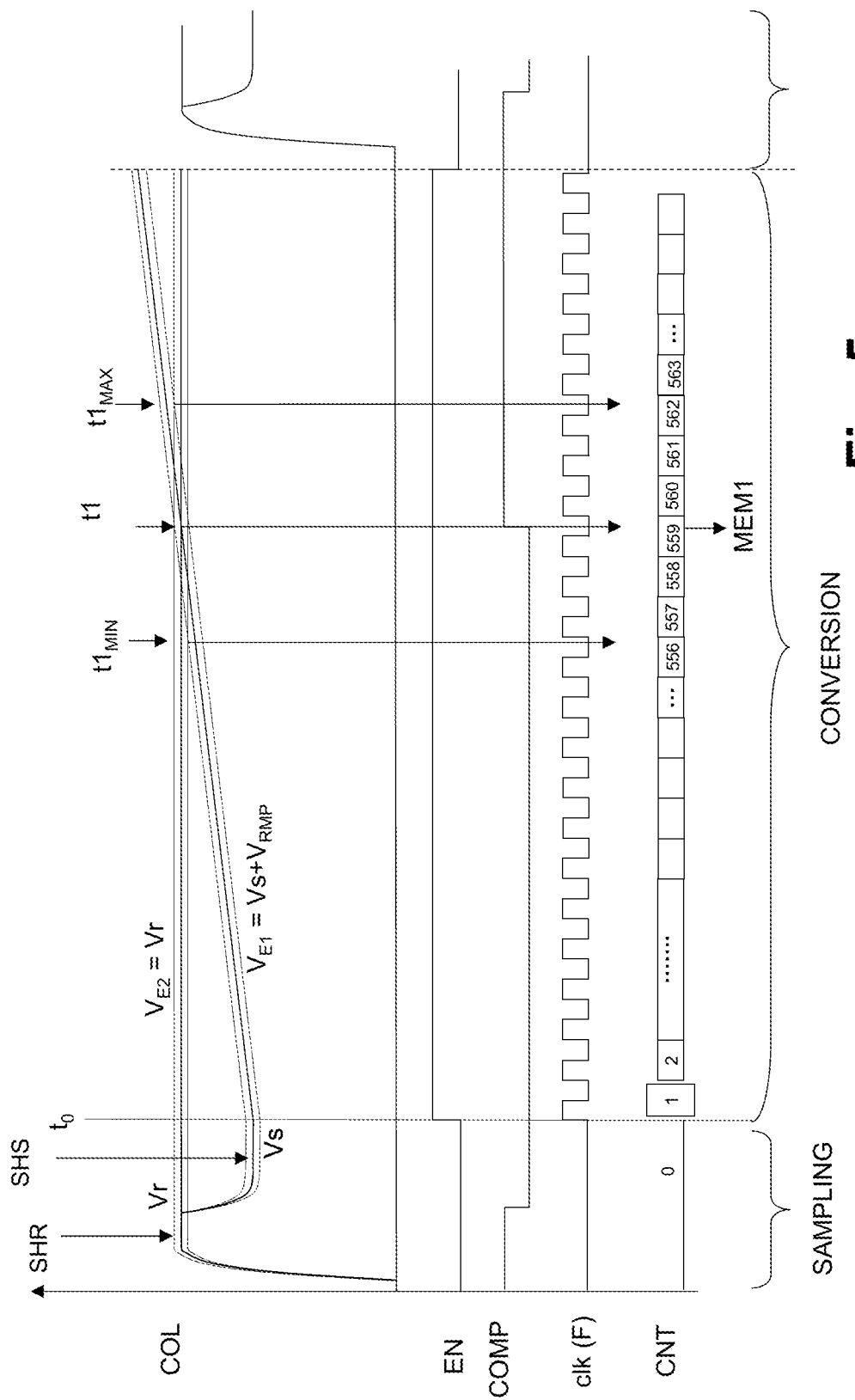
FIG. 5 is a timing diagram showing the conversion uncertainty linked to the noise present on the samples to be converted.

FIG. 5 represents the same timing diagram as FIG. 4, but the voltage level to be converted is noisy, both as far as the reset level Vr and as far as the useful level Vs are concerned.

This noise has been represented in the form of curves parallel to the levels of FIG. 4, but on either side thereof. In other words, the level Vr can vary within a certain range of values owing to the noise, as can the level Vs, independently of the level Vr. This means that there is no certainty as to the exact instant at which the voltages at the inputs E1 and E2 of the comparator cross when the input receives the linearly rising voltage Vs+$V_{RMP}$.

For a given theoretical value Vr and a theoretical value Vs, the instant of crossing can vary between two boundary instants $t1_{MIN}$ and $t1_{MAX}$.

A crossing at the instant $t1_{MIN}$ occurs in the extreme configuration in which Vr is at a lowest real level taking account of the noise while Vs is at a highest level taking account of the noise. Conversely, a crossing at the instant $t1_{MAX}$ occurs in the extreme configuration in which Vr is at a highest real level taking account of the noise while Vs is at a lowest level taking account of the noise.

Toggling of the comparator can then take place, as can be seen in FIG. 5, at instants for which the content of the counter is not the theoretical content that it should contain. In FIG. 5, the theoretical content of the counter at the moment of toggling is 559, but it is 556 at the instant $t1_{MIN}$ and 562 at the instant $t1_{MAX}$.

The noise may be from phenomena upstream of the converter, but also from the offset of the comparator and from other noise sources inside the converter.

Figure 6:
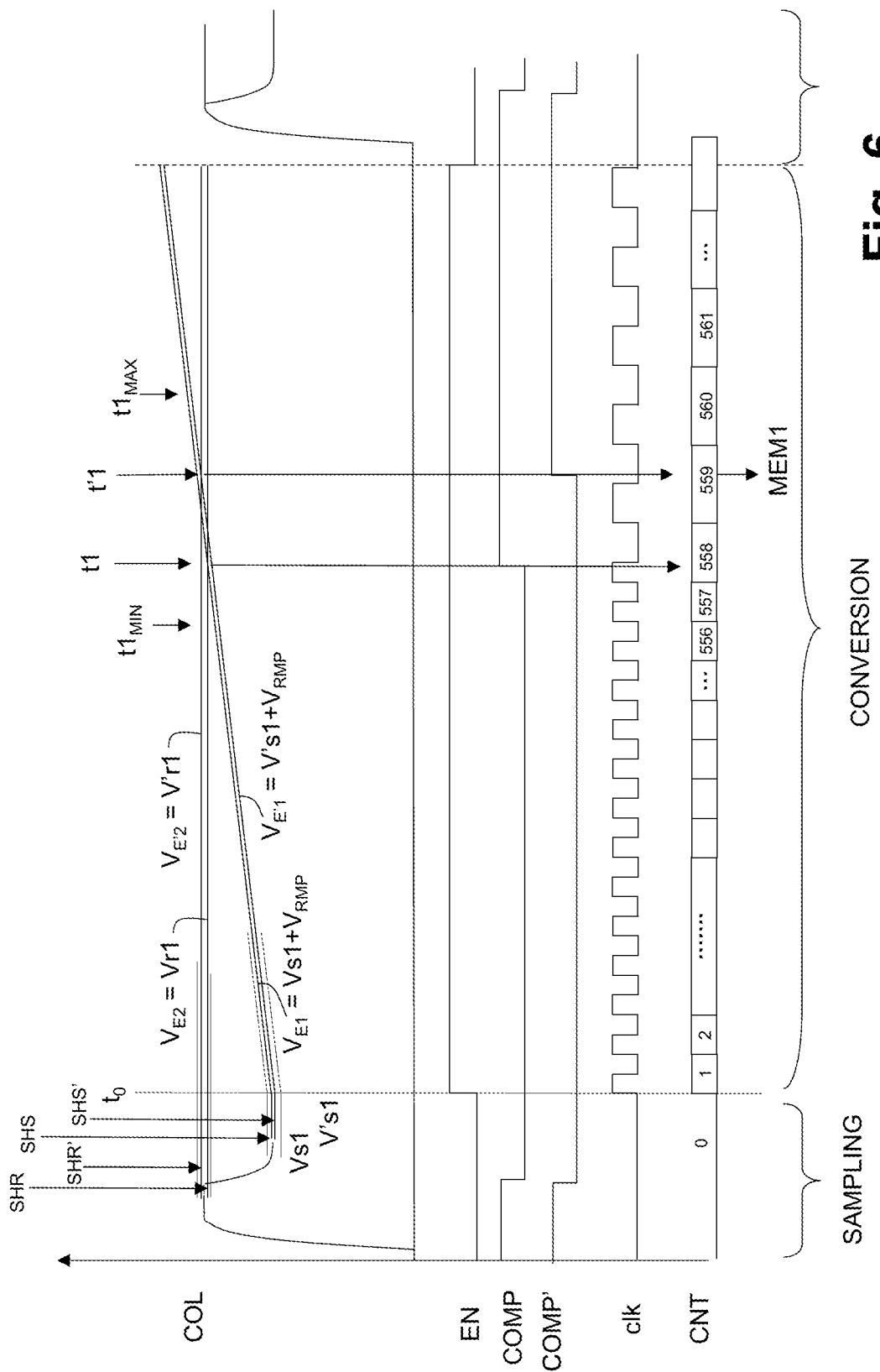
FIG. 6 is a timing diagram explaining the conversion method according to the invention allowing the noise present on the samples to be reduced.
Figure 7:
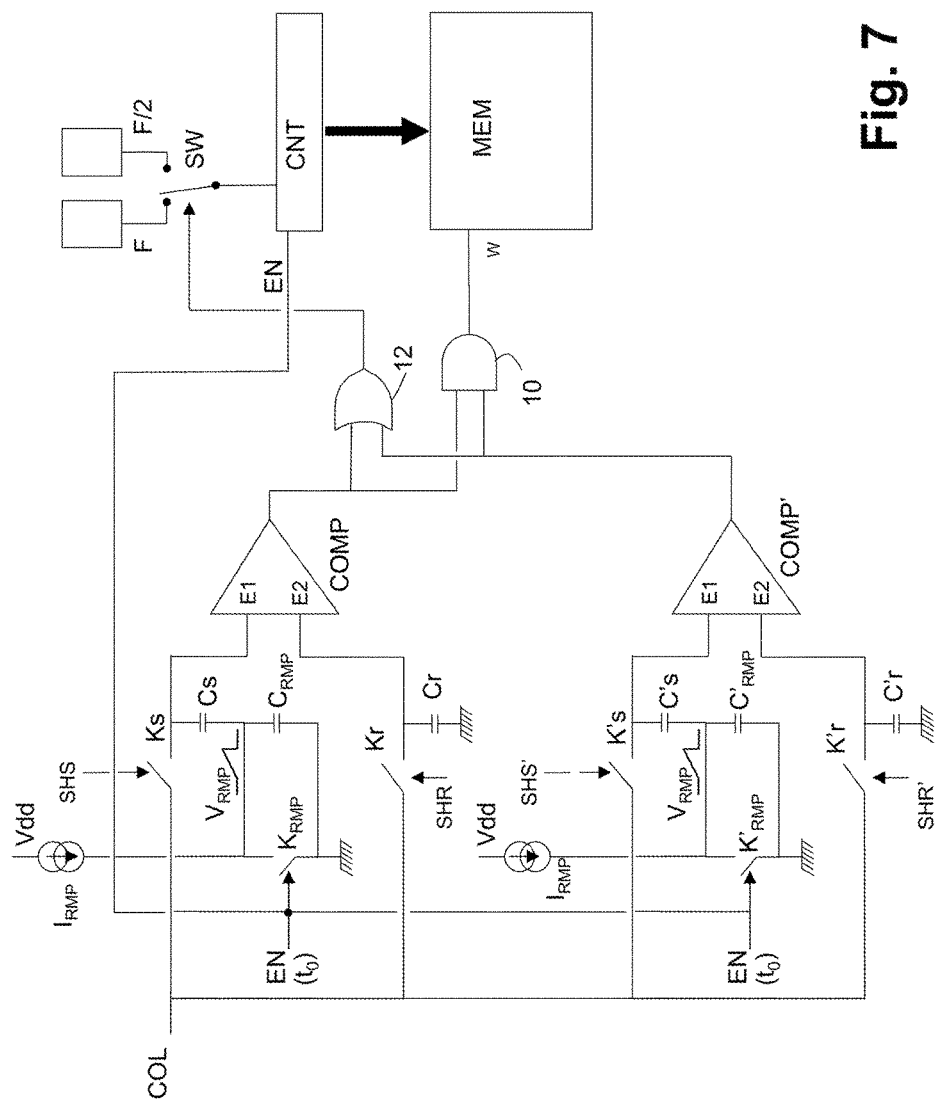
FIG. 7 represents a diagram of the converter according to the invention.

To minimize the effect of this noise, the invention proposes a method that will be understood by referring to FIG. 6 for the timing diagram and to FIG. 7 for the design of the conversion circuit.

This method consists in using two samplers that each take a pair of samples of the same measurement, and two comparators COMP and COMP', but a single counter CNT for counting a value that represents the average of the two sample differences, without needing to convert each of the pairs of samples with the aim of digitally adding them. In this case, a pair of samples is understood to mean the sample Vr and the sample Vs. The four samples can be taken at four different instants. They are considered to be taken at four different instants in this case.

The two samplers are identical to that from FIG. 3, and their operation will not be described again. They have capacitances Cr, Cs and C'r, C's, respectively, and switches Kr, Ks and K'r, K's, respectively. The samples for Vr are taken at two close instants defined by sampling commands SHR and SHR' and are denoted Vr1 and V'r1, and similarly for the samples of Vs, taken at instants SHS and SHS' and denoted Vs1 and V's1. The same linear ramp $V_{RMP}$ is applied to the capacitances Cs and C's (or in any case two identical ramps starting at the same instant). The circuit elements are identical in terms of design and in terms of digital values in the two samplers. The enabling signal EN is common. The voltages applied to the inputs of the first comparator are $V_{E1}$ and $V_{E2}$. Those that are applied to the second comparator are $V'_{E1}$ and $V'_{E2}$.

The crossing of the curves $V_{E1}$ and $V_{E2}$ in FIG. 5 would give a toggle instant for the first comparator at an instant t1 in between $t1_{MIN}$ and $t1_{MAX}$. Likewise, the crossing of the curves $V'_{E1}$ and $V'_{E2}$ for the second comparator gives a toggling of the second comparator at an instant t'1, also in between $t1_{MIN}$ and $t1_{MAX}$. The instant t1 may be before or after the instant t'1 depending on whether it is the first comparator or the second comparator that toggles first.

According to the invention, as soon as a comparator toggles, be it the first or the second, the counting frequency of the counter is divided by two. Counting is therefore slower. As soon as the other comparator toggles, the content of the counter is read, that is to say that the content of the counter is stored in the memory MEM.

This content is an average of the two samplings and this average is written directly to the memory, without there being the need to obtain a digital value for the first sample and a digital value for the second. This average reduces the uncertainty regarding the measurement in the presence of noise.

Thus, in the example of FIG. 5, it can be seen that the result of the conversion could range from 556 to 562 for a theoretical value of 559 if the signal was not noisy. In the example of FIG. 6, the result of the conversion, given by the toggling of the comparator that toggles second, is 559 owing to the counting at frequency F/2. The toggling of the first comparator in the presence of the samples Vr1 and Vs1 gives a result 558. If the counting had continued at frequency F as in FIG. 5, the toggling of the second comparator in the presence of the samples V'r1 and V's1 would have given a result 560.

FIG. 7 represents the corresponding diagram of the conversion circuit. The signal to be converted is in this case again assumed to be a signal from a column conductor COL of a matrix image sensor, on which a reset level and then a useful level for a differential measurement successively appear. The outputs of the comparators COMP and COMP' are connected to a small logic circuit (an AND gate 10 and an OR gate 12) that determines which comparator toggles first and that controls storage of the content of the counter in the memory from toggling of the other comparator.

The outputs of the comparators are considered to be active at the high logic level after toggling. They are connected to the two inputs of the OR gate 10. The output of the OR gate activates a switch SW that switches either a clock at frequency F (OR gate output at the low level) or a clock at frequency F/2 (OR gate output at the high level) to the incrementation control input of the counter. Initially, the counting frequency is F. It becomes F/2 from the toggling of one of the comparators.

Moreover, the outputs of the comparators are connected to the inputs of the AND gate. The output of the AND gate remains at the low level until the two comparators have toggled. When it changes to the high level, it controls storage of the content of the counter in the memory.

This principle of direct measurement of an average of two signals can be generalized to measurement of the average of N signals where N is greater than 2. By way of example, N can range from 3 to 10. In this case, N comparators are used rather than two. Each comparator of rank i receives a respective pair of samples of rank i, $V_i$s, among N pairs for which there is a need to obtain a digital value of the average of the differences $V_i$r-$V_i$s directly. The outputs of the comparators are connected to the inputs of a logic circuit that is more complex than that of FIG. 7, that is to say more complex than a simple pair of AND/OR gates. The logic function of this circuit is to determine the number j of comparators that have toggled at a given instant and accordingly to control a circuit for selecting a frequency among N possible frequencies that are the frequencies F, (N−1)F/N, (N−2)F/N, etc. . . . F/N. The logic circuit selects the frequency F at the start of the conversion, that is to say at the start of the linear ramp, and then the frequency F(N−j)/N if j comparators have toggled, j varying from 1 to N−1 in step with the togglings, regardless of which comparators have toggled. If two comparators toggle at the same time, there is a direct change from the frequency F(N−j+1)/N to the frequency F(N−j−1)/N.

The toggling of the last comparator triggers storage of the content of the counter, and this content represents the average of the N signals, that is to say the average of N voltage differences $V_ir-V_is$.

Figure 8:
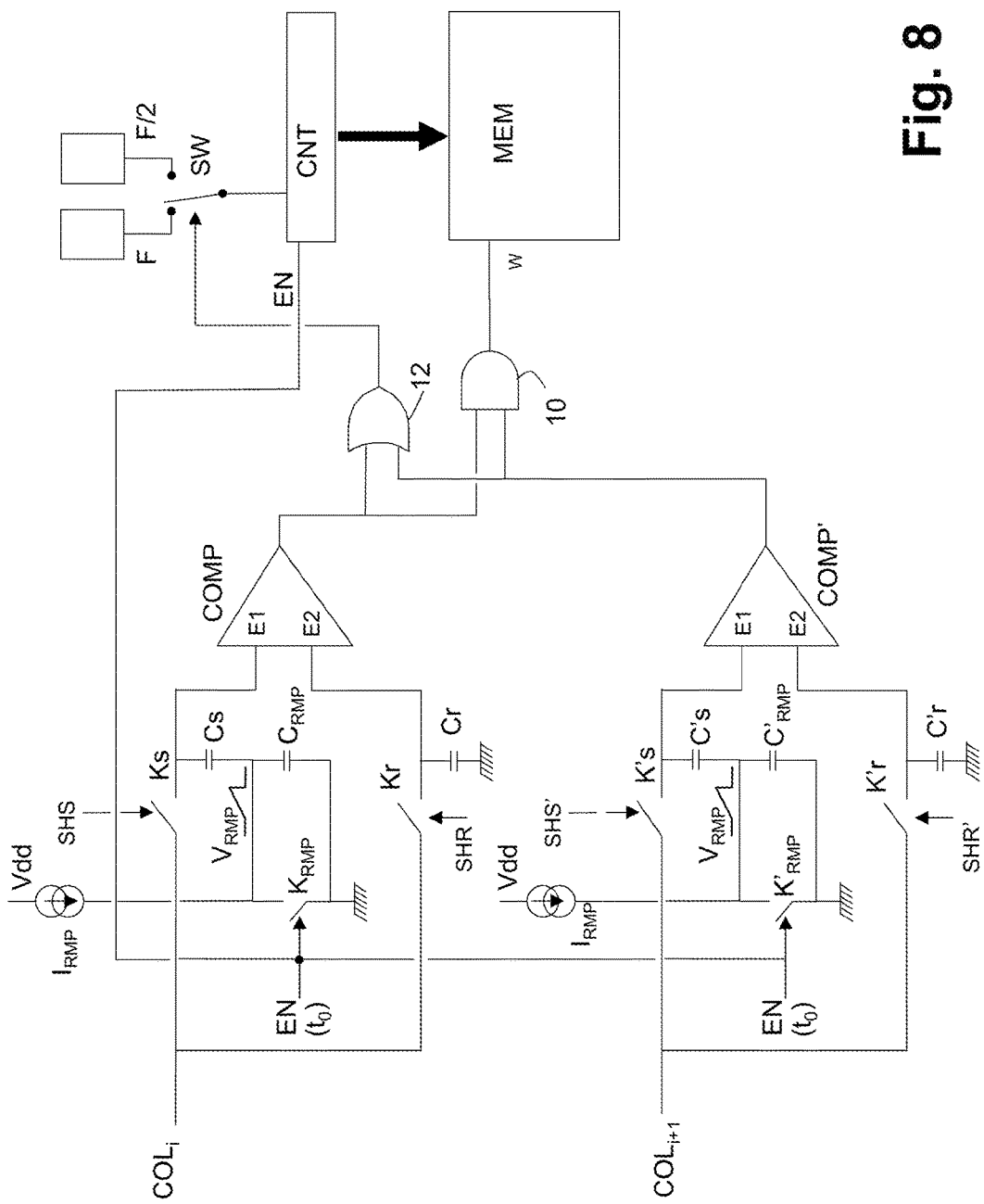
FIG. 8 represents a diagram of the converter allowing provision of the average of two signals corresponding to two adjacent pixels in a matrix image sensor.

FIG. 8 represents a diagram very similar to that of FIG. 7, and the common elements will not be described again; the difference from FIG. 7 is the fact that the conversion circuit is intended to provide a digital value of the average of measurements of different but similar signals, whereas FIG. 7 was concerned with the same signal at different sampling instants. The input signals are therefore different but the circuits associated with the comparators COMP and COMP' are identical and work in the same way.

By way of example, in a pixel matrix, there is a need to group the measurements provided by two adjacent pixels in one and the same row of pixels into a single average value. This is the case particularly when there is little light and sensitivity is to be increased at the expense of resolution.

At the moment of selection of the row, the two adjacent pixels provide reset voltages ($Vr_i$, $Vs_i$) and then useful voltages ($Vr_{i+1}$, $Vs_{i+1}$) on two adjacent column conductors $COL_i$ and $COL_{i+1}$; the reset voltages are sampled by a common signal SHR; the useful voltages are sampled by a signal SHS. The signals corresponding to the column of rank i are applied to the sample and hold circuit associated with the comparator COMP, and the signals corresponding to the column of rank i+1 are applied to the sample and hold circuit associated with the comparator COMP'.

Depending on the value of the sample differences, it is the comparator COMP or the comparator COMP' that toggles first in the course of the common ramp. The counter that counted at the frequency F counts at the frequency F/2 from the toggling.

When the other comparator toggles, the content of the counter is stored. It represents the average of the measurements of the two pixels (average between the difference $Vs_i$-$Vr_i$ in the samples from the column of rank i and the different $Vs_{i+1}$-$Vr_{i+1}$ in the samples from the column of rank i+1).

Figure 9:
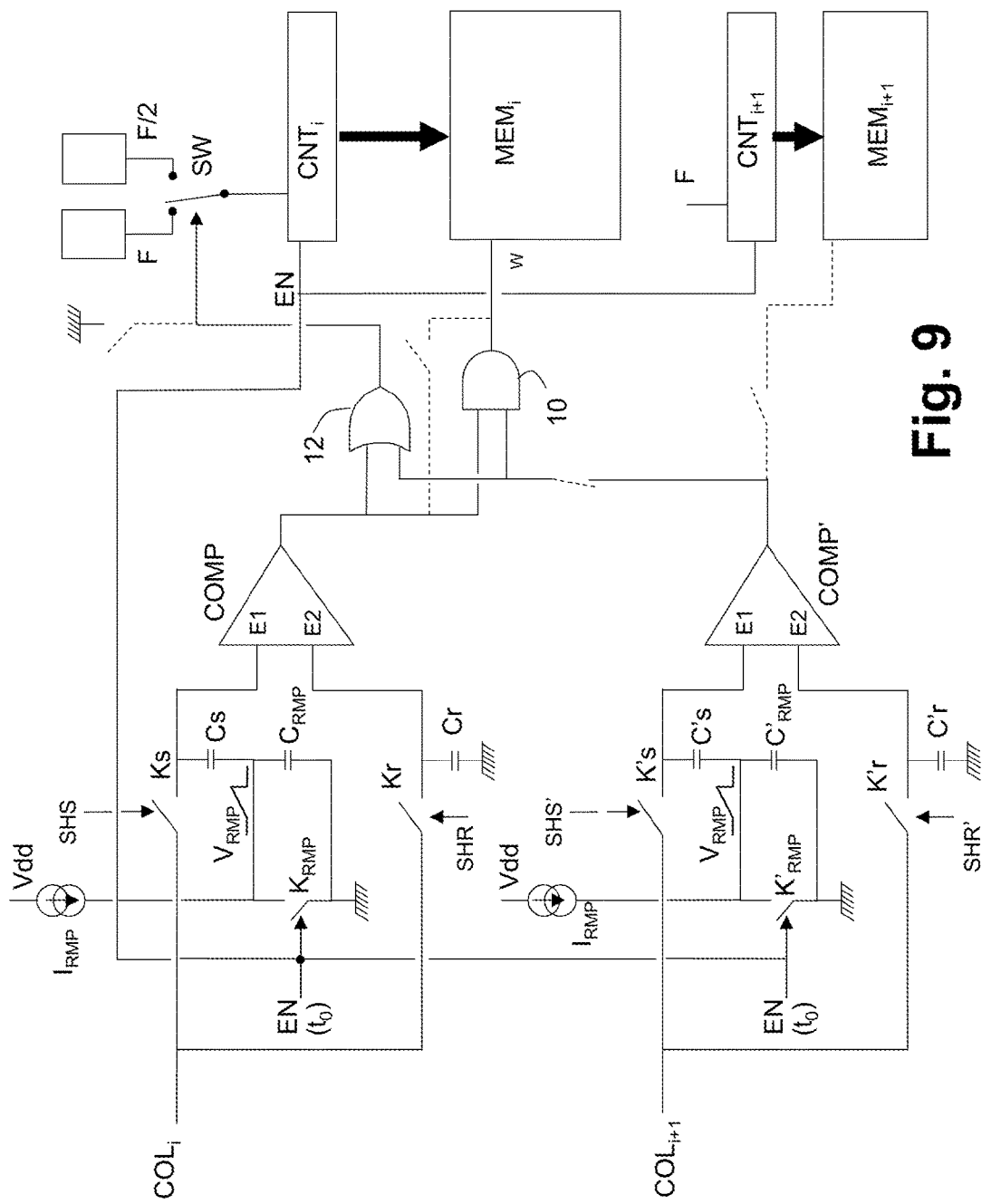
FIG. 9 represents a diagram of the converter allowing provision of either the average of two measurements or the individual measurements.

If the circuit of FIG. 8 is to be able to be used either in a mode for averaging two adjacent pixels or in a mode for individually reading each pixel, this diagram can be modified as indicated in FIG. 9, in which there have been added a counter $CNT_{i+1}$ (counting at frequency F) and a memory $MEM_{i+1}$ for the individual conversion of the signals from the column $COL_{i+1}$, and a group of multiple switches represented in dashed lines, which make it possible to change from the averaging mode of FIG. 8 to a mode for individually reading the columns:

switch that connects the output of the comparator COMP' to the memory $MEM_{i+1}$ so that the latter is able to record the measurement of the column of rank i+1, switch that freezes the output of the OR gate at zero, so that there is no further change of counting frequency;

switch that shorts the AND gate in order to connect the output of the comparator COMP to the memory $MEM_i$, so that only the toggling of the comparator COMP acts on the memory $MEM_i$ possibly a switch that disconnects the output of the comparator COMP' from the OR and AND gates used for averaging, in order to stop performing the averaging.

The arrangement of these switches is given only by way of example, to illustrate the change of mode, many other switching logic circuits being able to be imagined.

The invention claimed is:

1. An analog-digital conversion method comprising:
providing N pairs of samples of either a same voltage or of respective voltages to respective pairs of inputs of N comparators,
applying a clock signal comprising sequence of pulses at a frequency F, called counting frequency, to a counter configured for counting the said pulses,
adding a same voltage ramp to one sample of each pair,
whenever a comparator trips, changing the counting frequency to a value F·(N−j)/N, j being a number of comparators that have tripped since said starting instant, and
storing a content of the said counter when the Nth comparator trips;
wherein N is a positive integer greater than 1.

2. The conversion method as claimed in claim 1, wherein N=2.

3. The conversion method as claimed in claim 1, wherein all comparators receive samples of a same pair of voltages in order to reduce reading noise.

4. The conversion method as claimed in claim 3, wherein the samples are taken at different instants.

5. The conversion method as claimed in claim 1, wherein the N comparators receive simultaneously N different pairs of samples in order to provide an average of those N pairs of samples.

6. A ramp analog-digital converter comprising:
a circuit configured for setting up a voltage ramp,
a clock generator for generating a clock signal at a selectable frequency, said clock signal comprising a series of pulses,
a counter configured for counting the clock signal pulses from a starting instant of the said voltage ramp,
N comparators, each having a pair of inputs for receiving N respective pairs of samples of either a same voltage or of respective voltage, one voltage sample of each pair being received on a respective input of a comparator,
a summing circuit for adding said voltage ramp to one sample of each pair,
a logic circuit configured for selecting an initial frequency F of the clock generator and a frequency F·(N−j)/N of the clock generator whenever a comparator trips, j being a number of comparators that have tripped since said starting instant, and
a memory for storing counter content when the Nth comparator trips;
N being a positive integer greater than 1.

7. The ramp analog-digital converter as claimed in claim 6, wherein N=2.

8. A matrix image sensor comprising a converter as claimed in claim 6, wherein the N pairs of samples are provided by a column conductor connecting the pixels of one and the same pixel column, the samples being taken at 2N different instants.

9. The matrix image sensor comprising a converter as claimed in claim 8, wherein said pairs of samples are provided by respective column conductors, each connecting the pixels of one and the same pixel column.

* * * * *